(12) United States Patent
Hughes

(10) Patent No.: US 7,477,113 B1
(45) Date of Patent: *Jan. 13, 2009

(54) VOLTAGE-CONTROLLED CAPACITANCE LINEARIZATION CIRCUIT

(75) Inventor: Rodney A. Hughes, Tacoma, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 53 days.

This patent is subject to a terminal disclaimer.

(21) Appl. No.: 11/017,416

(22) Filed: Dec. 20, 2004

Related U.S. Application Data

(63) Continuation-in-part of application No. 10/295,221, filed on Nov. 15, 2002, now Pat. No. 6,853,272.

(51) Int. Cl.
*H03B 5/12* (2006.01)
(52) U.S. Cl. .................... 331/177 V; 331/117 FE; 331/36 C
(58) Field of Classification Search ............... 331/36 C, 331/117 FE, 177 V
See application file for complete search history.

(56) References Cited

U.S. PATENT DOCUMENTS

| | | | | |
|---|---|---|---|---|
| 3,353,117 A | * | 11/1967 | Renkowitz | 331/113 R |
| 3,519,954 A | * | 7/1970 | Parkyn | 331/177 V |
| 6,292,065 B1 | * | 9/2001 | Friedman et al. | 331/117 R |
| 6,853,272 B1 | * | 2/2005 | Hughes | 334/15 |
| 6,995,626 B2 | * | 2/2006 | Oehm et al. | 331/177 V |
| 2005/0258914 A1 | * | 11/2005 | Takagi | 331/177 V |

FOREIGN PATENT DOCUMENTS

WO WO03/075451 * 2/2003

* cited by examiner

*Primary Examiner*—Robert J. Pascal
*Assistant Examiner*—James E Goodley

(57) ABSTRACT

A linear voltage-controlled capacitance circuit is provided that includes a plurality of differentially coupled metal-oxide-semiconductor (MOS) varactor pairs. Each MOS varactor pair is operable to receive a same tuning voltage and to receive a bias voltage unique to the MOS varactor pair. The capacitance circuit is operable to generate a positive tank node signal and a negative tank node signal based on the tuning voltage and the bias voltages.

19 Claims, 3 Drawing Sheets

VOLTAGE-CONTROLLED CAPACITANCE LINEARIZATION CIRCUIT

RELATED APPLICATION

This application is a continuation-in-part of U.S. application Ser. No. 10/295,221, filed on Nov. 15, 2002, now U.S. Pat. No. 6,853,272, entitled "Linear Voltage Controlled Capacitance Circuit".

TECHNICAL FIELD OF THE INVENTION

The present invention relates generally to resonant LC tank circuits employed in programmable tuned circuit applications and, more particularly, to a linear voltage-controlled capacitance circuit with fine-tuning gain compensation.

BACKGROUND OF THE INVENTION

Voltage-controlled capacitance elements, or varactors, are useful in oscillator circuits that are commonly used in communication devices, as well as in many other applications. Resonant tank circuits are often used for radio frequency oscillator circuits because of their high-resonance frequency of operation, low phase and amplitude noise, and low power consumption. In order to tune such a circuit, capacitance is typically controlled by an external circuit to vary the frequency of resonance. A large capacitance control variance range is often necessary to compensate for manufacturing variances of the individual components, as well as to provide a means to cover a wide tuning frequency range in many applications. This is often accomplished by means of coarse tuning switched capacitors applied to the tank circuit and a fine-tuning voltage-controlled capacitance, or varactor, generally driven by an analog control feedback loop such as a phase-locked loop system.

In such a control feedback system, it is desirable to control the voltage-to-frequency gain constant across the tuning range. This implies that the voltage-to-capacitance transfer function be linear. This also requires that the fine tune capacitance range be a constant percentage of the total tank capacitance. The fine-tuning capacitance range must increase when switching more coarse tuning capacitance onto the tank circuit. In voltage-controlled oscillators, this gain factor is referred to as Kvco, or the gain of the voltage-controlled oscillator.

With regard to the varactor element of the oscillator circuit, the two primary factors that contribute to phase noise are (i) the quality factor, Q, of the varactor element and (ii) the non-linear varactor capacitance-versus-voltage transfer characteristics that cause excessively high voltage-controlled oscillator gain.

One type of varactor element, the metal-oxide-semiconductor (MOS) varactor element, has been shown to have advantageous quality factor characteristics over the more common junction varactor elements. However, the strongly non-linear capacitance-voltage (CV) transfer characteristic, coupled with a very limited tuning range, has limited the usefulness of MOS varactor elements. In addition, some MOS varactor elements have a non-monotonic CV transfer characteristic just outside the upper end of their limited tuning range.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

Figure 1:
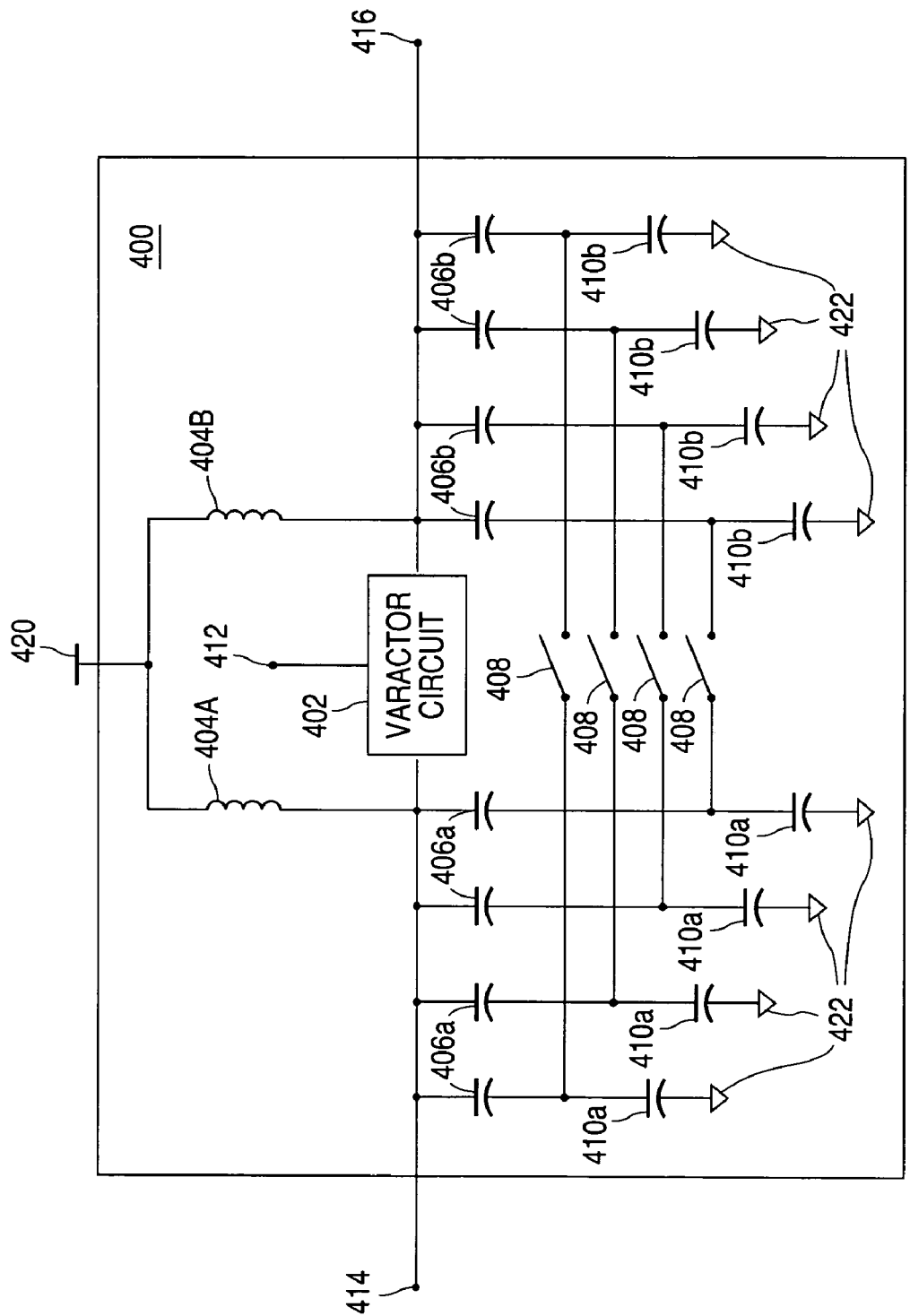
FIG. 1 is a block diagram illustrating a tank circuit in accordance with a first embodiment of the present invention.
Figure 2:
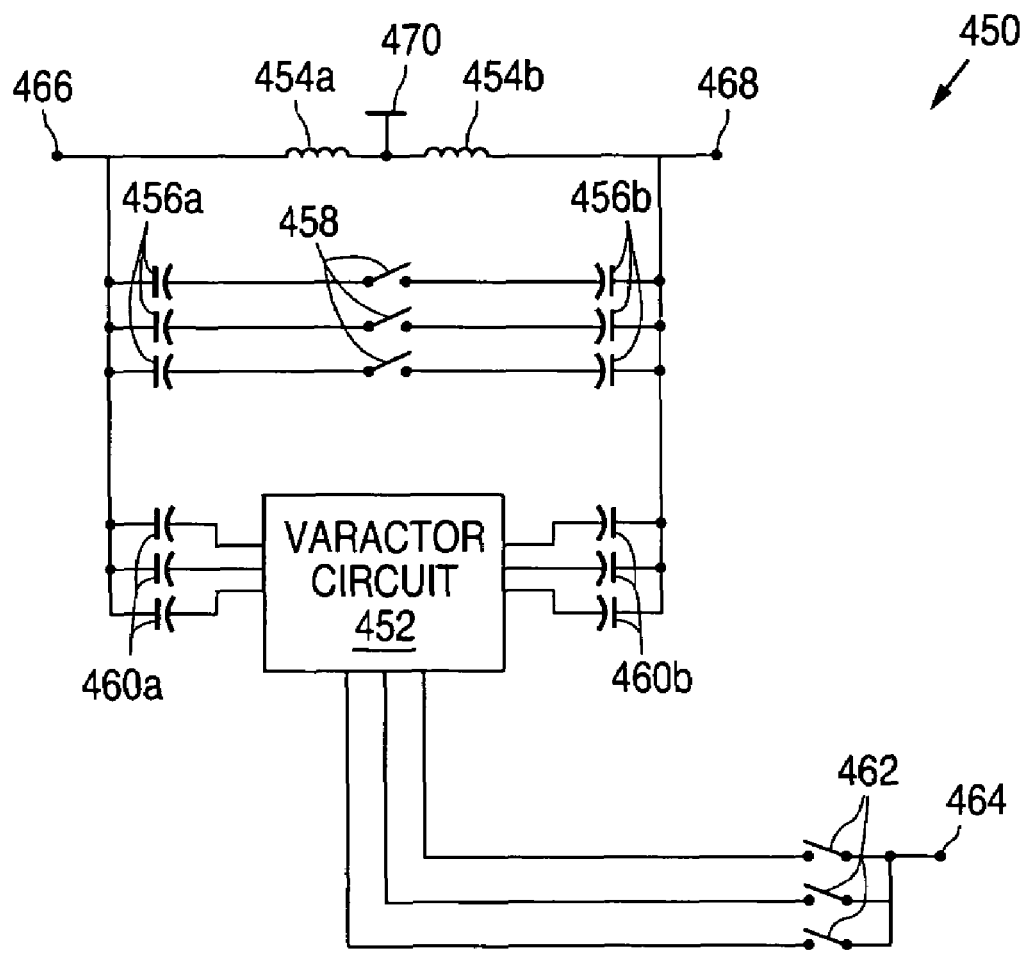
FIG. 2 is a block diagram illustrating a tank circuit in accordance with a second embodiment of the present invention.
Figure 3:
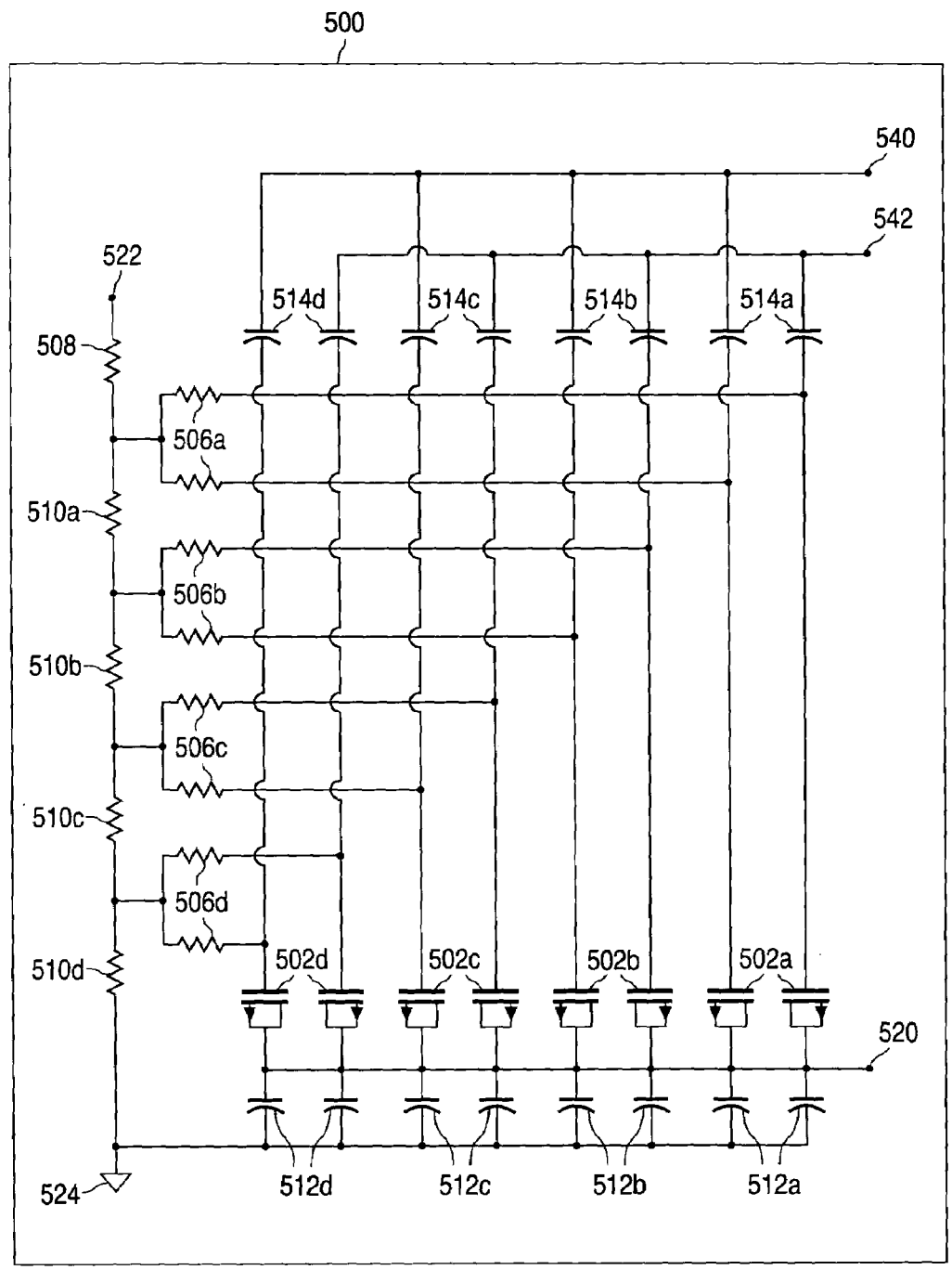
FIG. 3 is a block diagram illustrating the linear voltage-controlled capacitance circuit of FIG. 1 or 2 in accordance with one embodiment of the present invention.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged tank circuit.

FIG. 1 is a block diagram illustrating a tank circuit 400 in accordance with one embodiment of the present invention. The tank circuit 400 may be implemented in a voltage-controlled oscillator, a resonant filter, or any other suitable device. The tank circuit 400 comprises a varactor circuit 402, a plurality of inductors 404, a plurality of capacitors 406 and 410, and a plurality of switches 408.

Although the illustrated tank circuit 400 comprises eight capacitors 406 and 410 and four switches 408, it will be understood that the tank circuit 400 may comprise any suitable number of capacitors 406 and 410 and switches 408 without departing from the scope of the present invention. According to one embodiment, the switches 408 comprise MOS switches.

The tank circuit 400 is operable to receive a voltage control signal from a voltage control node 412 and, based on the voltage control signal, to generate a positive tank node signal at a positive tank node 414 and a negative tank node signal at a negative tank node 416. According to an embodiment in which the tank circuit 400 is implemented in a voltage-controlled oscillator of a frequency synthesizer, the voltage control signal may correspond to a loop filter output signal. The varactor circuit 402 is coupled to the voltage control node 412, the positive tank node 414 and the negative tank node 416.

For the illustrated embodiment, a first inductor 404*a* is coupled to a power supply 420 and to the positive tank node 414, and a second inductor 404*b* is coupled to the power supply 420 and to the negative tank node 416. In addition, each of a first set of capacitors 406*a* is coupled to the positive tank node 414 and to a corresponding capacitor 410*a* in a second set of capacitors 410*a*. Each of the pairs of capacitors 406*a* and 410*a* is also coupled to a switch 408, and the second set of capacitors 410*a* is coupled to ground 422. As used herein, "each" means every one of at least a subset of the identified items.

Each of a third set of capacitors 406*b* is coupled to the negative tank node 416 and to a corresponding capacitor 410*b* in a fourth set of capacitors 410*b*. Each of the pairs of capacitors 406*b* and 410*b* is also coupled to a switch 408 that is coupled to a pair of capacitors 406*a* and 410*a*, and the fourth set of capacitors 410*b* is coupled to ground 422.

The varactor circuit 402 comprises a linear voltage-controlled capacitance circuit, as described in more detail below in connection with FIG. 3. It will be understood that the inductors 404 may provide any suitable amount of inductance and the capacitors 406 and 410 may provide any suitable amount of capacitance without departing from the scope of the present invention.

The switches 408 may be controlled by a control system (not shown in FIG. 1) that is operable to measure frequency output and to determine whether to close additional switches 408 to remove capacitors 410 in order to lower the frequency or to open additional switches 408 to add capacitors 410 in order to raise the frequency.

FIG. 2 is a block diagram illustrating a tank circuit 450 in accordance with another embodiment of the present invention. The tank circuit 450 may be implemented in a voltage-controlled oscillator, a resonant filter, or any other suitable device. The tank circuit 450 comprises a varactor circuit 452, a plurality of inductors 454, a plurality of coarse tune capacitors 456 and fine tune capacitors 460, and a plurality of coarse tune switches 458 and gain control switches 462.

Although the illustrated tank circuit 450 comprises six capacitors 456 and 460 and three switches 458 and 462, it will be understood that the tank circuit 450 may comprise any suitable number of capacitors 456 and 460 and switches 458 and 462 without departing from the scope of the present invention.

The tank circuit 450 is operable to receive a voltage control signal from a voltage control node 464 and, based on the voltage control signal, to generate a positive tank node signal at a positive tank node 466 and a negative tank node signal at a negative tank node 468. According to an embodiment in which the tank circuit 450 is implemented in a voltage-controlled oscillator of a frequency synthesizer, the voltage control signal may correspond to a loop filter output signal.

For the illustrated embodiment, a first inductor 454*a* is coupled to a power supply 470 and to the positive tank node 466, and a second inductor 454*b* is coupled to the power supply 470 and to the negative tank node 468. In addition, each of a first set of coarse tune capacitors 456*a* is coupled to the positive tank node 466 and to a coarse tune switch 458, which is operable to couple each coarse tune capacitor 456*a* to a corresponding coarse tune capacitor 456*b* in a second set of coarse tune capacitors 456*b*. Each of the coarse tune capacitors 456*b* is coupled to the negative tank node 468.

It will be understood that the inductors 454 may provide any suitable amount of inductance and the capacitors 456 and 460 may provide any suitable amount of capacitance without departing from the scope of the present invention.

The coarse tune switches 458 may be controlled by a control system (not shown in FIG. 2) that is operable to measure frequency output and to determine whether to close additional switches 458 to add capacitors 456 in order to raise the frequency or to open additional switches 458 to remove capacitors 456 in order to lower the frequency. Similarly, the gain control switches 462 may be controlled by a control system (not shown in FIG. 2) that is operable to determine whether to close switches 462 to provide tuning bits to the varactor circuit 452 for fine tuning or to open switches 462 to remove tuning bits from the varactor circuit 452. According to one embodiment, the switches 458 and 462 comprise MOS switches.

The varactor circuit 452 comprises a linear voltage-controlled capacitance circuit, as described in more detail below in connection with FIG. 3. The varactor circuit 452, which provides a gain control mechanism for the tank circuit 450, may be coupled to the voltage control node 464 through the gain control switches 462 and is coupled to the positive tank node 466 through the fine tune capacitors 460*a* and to the negative tank node 468 through the fine tune capacitors 460*b*.

In operation, a tuning voltage at the voltage control node 464 is applied to the gain control switches 462 and may be provided to the varactor circuit 452 in the form of tuning bits. According to the embodiment in which the tank circuit 450 is implemented in a voltage-controlled oscillator of a frequency synthesizer, the tuning voltage may correspond to a loop filter output signal during normal operation.

When closed, each gain control switch 462 provides a tuning bit to the varactor circuit 452. Thus, because the illustrated embodiment comprises three gain control switches 462, up to three tuning bits may be provided to the varactor circuit 452 for this embodiment. However, as the tank circuit 450 may comprise any suitable number of gain control switches 462, it will be understood that the varactor circuit 452 may receive any suitable number of tuning bits without departing from the scope of the present invention.

The tuning bits may comprise digital control bits that are operable to vary the capacitance-voltage (CV) transfer characteristic of the varactor circuit 452. For example, if each of the tuning bits is in one state, the varactor circuit 452 may provide a minimum gain, while if each of the tuning bits is in the opposite state, the varactor circuit 452 may provide a maximum gain.

The coarse tune switches 458 may be used to provide coarse tuning of the output frequency for the tank circuit 450, and the control voltage may be used to provide fine-tuning of the output frequency. Thus, during coarse tuning, the tuning voltage may be set to a mid-range voltage, and the coarse tuning may be performed using the coarse tune switches 458, while also simultaneously adjusting the gain control switches 462. According to one embodiment, the tuning bits comprise the most significant bits of a coarse tuning signal for the tank circuit 450. After coarse tuning, the control voltage connection is then reconnected to the loop filter for fine-tuning.

FIG. 3 is a block diagram illustrating a linear voltage-controlled capacitance circuit 500 in accordance with one embodiment of the present invention. The linear voltage-controlled capacitance circuit 500 may be used as the varactor circuit 402 and/or as the varactor circuit 452. However, it will be understood that the linear voltage-controlled capacitance circuit 500 may be used as a varactor circuit in any suitable circuit other than the tank circuit 400 or the tank circuit 450 without departing from the scope of the present invention.

The linear voltage-controlled capacitance circuit 500 comprises a set of differentially coupled MOS varactor pairs 502, a plurality of resistors 506, 508 and 510, and a plurality of capacitors 512 and 514. For the illustrated embodiment, each MOS varactor pair 502 comprises both a first and second n-type MOS varactor device. However, it will be understood that each MOS varactor pair 502 may comprise a first and second p-type MOS varactor device without departing from the scope of the present invention.

In addition, while the illustrated embodiment comprises four MOS varactor pairs 502, along with four pairs of resistors 506, four resistors 510, four pairs of capacitors 512, and four pairs of capacitors 514, it will be understood that the capacitance circuit 500 may comprise any suitable number of MOS varactor pairs 502, along with the corresponding number of resistors 506 and 510 and capacitors 512 and 514, without departing from the scope of the present invention. A greater number of MOS varactor pairs 502 provides more control over linearization due to the increased voltage division; however, additional MOS varactor pairs 502 will also introduce additional noise.

Each of the MOS varactor devices in a MOS varactor pair 502 has a well connection that forms a voltage-controlled capacitive element to the gate. The capacitances of the MOS varactor pairs 502 are dependent on the voltages between the gates and the well connections of the MOS varactor devices.

In operation, a tuning voltage at a voltage-controlled tuning node 520 is applied to the well connections of the varactor devices of the MOS varactor pairs 502. According to the embodiment in which the tank circuit is implemented in a voltage-controlled oscillator of a frequency synthesizer, the tuning voltage may correspond to a loop filter output signal during normal operation.

A bias voltage at a bias voltage node 522 is applied to the resistor 508 before being passed to the gates of the varactor devices of the MOS varactor pairs 502 through the resistors 506 and 510. The bias voltage comprises a constant, regulated DC voltage.

The gate of each varactor device in the set of MOS varactor pairs 502 is coupled to a corresponding resistor 506. Thus, each MOS varactor pair 502 is coupled to a resistor pair 506. Each pair of resistors 506 is coupled to a corresponding resistor 510, and the set of resistors 510 is coupled in series with each other and, through the resistor 508, to the bias voltage node 522. In this way, each MOS varactor pair 502 receives a different DC bias voltage due to the voltage division created by the resistors 508 and 510.

The well connection of each varactor device in the set of MOS varactor pairs 502 is coupled to a corresponding capacitor 512 that is also coupled to ground 524, which provides a filter for each MOS varactor pair 502. The resistor 510d is also coupled to ground 524.

The tuning switches 408 of FIG. 1 may be used to provide coarse tuning of the output frequency for the tank circuit, and the tuning voltage may be used to provide fine-tuning of the output frequency. Thus, during tuning, the tuning voltage may be set to a mid-range voltage, and the coarse tuning may be performed using the switches 408 as described above. For the embodiment in which the tank circuit is implemented in a voltage-controlled oscillator of a frequency synthesizer, the voltage-controlled tuning node 520 may then be re-coupled to a loop filter of a frequency synthesizer in order to lock the appropriate frequency.

The linear voltage-controlled capacitance circuit 500 is operable to generate a positive tank node signal at a positive tank node 540 and a negative tank node signal at a negative tank node 542. The positive tank node 540 is coupled to the gate of the first varactor device in each MOS varactor pair 502 through a first capacitor in a capacitor pair 514, and the negative tank node 542 is coupled to the gate of the second varactor device in each MOS varactor pair 502 through a second capacitor in the same capacitor pair 514.

Each varactor device in a particular MOS varactor pair 502 is substantially matched such that any AC current flowing through the resistors 508 and 510 and the capacitors 512 is minimized. In addition, the DC bias points are selected such that the combined equivalent differential capacitance seen across the positive and negative tank nodes 540 and 542 has a linear voltage variable characteristic with the tuning voltage. The capacitors 514 will also have some voltage-dependent capacitance characteristic that may be corrected by appropriate selection of the DC bias points. It will be understood that the resistors 506, 508 and 510 may provide any suitable amount of resistance and the capacitors 512 and 514 may provide any suitable amount of capacitance without departing from the scope of the present invention.

Although the present invention has been described with several embodiments, various changes and modifications may be suggested to one skilled in the art. It is intended that the present invention encompass such changes and modifications as fall within the scope of the appended claims.

What is claimed is:

1. A linear voltage-controlled capacitance circuit, comprising:
    a plurality of differentially coupled metal-oxide-semiconductor (MOS) varactor pairs, each MOS varactor pair comprising a first varactor device and a second varactor device, all varactor devices in the MOS varactor pairs operable to receive a same tuning voltage, each MOS varactor pair operable to receive a bias voltage unique to that MOS varactor pair, the circuit operable to generate a positive tank node signal and a negative tank node signal based on the tuning voltage and the bias voltages;
    a tuning node coupled to each of the varactor devices in the MOS varactor pairs, the tuning node operable to receive the same tuning voltage and to provide the same tuning voltage to each MOS varactor pair;
    a plurality of first capacitors, each first capacitor coupled to (i) a source terminal and a drain terminal of each of the varactor devices through the tuning node and (ii) a ground potential;
    a plurality of second capacitors, each second capacitor coupled to a gate terminal of one of the first varactor devices; and
    a plurality of third capacitors, each third capacitor coupled to a gate terminal of one of the second varactor devices;
    wherein the first capacitors are not connected to the same terminals of the varactor devices as the second and third capacitors.

2. The circuit of claim 1, each unique bias voltage comprising a first bias voltage and a second bias voltage.

3. The circuit of claim 2, the first varactor devices operable to receive the first bias voltages and the second varactor devices operable to receive the second bias voltages.

4. The circuit of claim 3, further comprising a set of resistors coupled in series, the set of resistors operable to divide a circuit bias voltage to generate a plurality of bias voltages, the plurality of bias voltages corresponding to the unique bias voltages.

5. The circuit of claim 4, further comprising a set of resistor pairs, each resistor pair coupled to the set of resistors and operable to receive one of the plurality of bias voltages, a first resistor in each resistor pair operable to generate the first bias voltage based on the one of the plurality of bias voltages received at the resistor pair and a second resistor in each resistor pair operable to generate the second bias voltage based on the one of the plurality of bias voltages received at the resistor pair.

6. The circuit of claim 1, further comprising:
a positive tank node coupled to the first varactor device in each MOS varactor pair, the positive tank node operable to generate the positive tank node signal; and
a negative tank node coupled to the second varactor device in each MOS varactor pair, the negative tank node operable to generate the negative tank node signal.

7. A linear voltage-controlled capacitance circuit, comprising:
a plurality of differentially coupled MOS varactor pairs, each MOS varactor pair comprising a first varactor device and a second varactor device, each of the first varactor devices operable to receive a first bias voltage unique to the MOS varactor pair and each of the second varactor devices operable to receive a second bias voltage unique to the MOS varactor pair;
a tuning node coupled to the MOS varactor pairs, the tuning node operable to receive a single tuning voltage and to provide the same single tuning voltage to all of the varactor devices in the MOS varactor pairs;
a plurality of first capacitors, each first capacitor coupled to (i) a source terminal and a drain terminal of each of the varactor devices and (ii) a ground potential;
a plurality of second capacitors, each second capacitor coupled to a gate terminal of one of the first varactor devices; and
a plurality of third capacitors, each third capacitor coupled to a gate terminal of one of the second varactor devices;
wherein the first capacitors are not connected to the same terminals of the varactor devices as the second and third capacitors.

8. The circuit of claim 7, further comprising:
a positive tank node coupled to the first varactor device in each MOS varactor pair, the positive tank node operable to generate a positive tank node signal based on the tuning voltage and the bias voltages; and
a negative tank node coupled to the second varactor device in each MOS varactor pair, the negative tank node operable to generate a negative tank node signal based on the tuning voltage and the bias voltages.

9. The circuit of claim 7, further comprising a set of resistors coupled in series, the set of resistors operable to divide a circuit bias voltage to generate a plurality of bias voltages, the plurality of bias voltages corresponding to the unique bias voltages.

10. The circuit of claim 9, further comprising a set of resistor pairs, each resistor pair coupled to the set of resistors and operable to receive one of the plurality of bias voltages, a first resistor in each resistor pair operable to generate the first bias voltage based on the one of the plurality of bias voltages received at the resistor pair and a second resistor in each resistor pair operable to generate the second bias voltage based on the one of the plurality of bias voltages received at the resistor pair.

11. A tank circuit, comprising:
a first inductor;
a second inductor;
a plurality of first capacitors coupled to the first inductor and in parallel with each other;
a plurality of second capacitors, each of the second capacitors coupled to a corresponding one of the first capacitors;
a plurality of third capacitors coupled to the second inductor and in parallel with each other;
a plurality of fourth capacitors, each of the fourth capacitors coupled to a corresponding one of the third capacitors;
a plurality of switches, each switch coupled between one of the first capacitors and a corresponding second capacitor and between one of the third capacitors and a corresponding fourth capacitor; and
a linear voltage-controlled capacitance circuit coupled to the first and second inductors and to the plurality of first and third capacitors, the capacitance circuit comprising a plurality of differentially coupled MOS varactor pairs, each MOS varactor pair operable to receive a same tuning voltage.

12. The circuit of claim 11, each MOS varactor pair operable to receive a bias voltage unique to the MOS varactor pair, the circuit operable to generate a positive tank node signal and a negative tank node signal based on the tuning voltage and the bias voltages.

13. The circuit of claim 12, each unique bias voltage comprising a first bias voltage and a second bias voltage.

14. The circuit of claim 13, each MOS varactor pair comprising a first varactor device and a second varactor device, the first varactor devices operable to receive the first bias voltages and the second varactor devices operable to receive the second bias voltages.

15. The circuit of claim 11, further comprising:
a positive tank node coupled to the first varactor device in each MOS varactor pair, the positive tank node operable to generate the positive tank node signal; and
a negative tank node coupled to the second varactor device in each MOS varactor pair, the negative tank node operable to generate the negative tank node signal.

16. A tank circuit, comprising:
a first inductor;
a second inductor;
a plurality of first coarse tune capacitors coupled to the first inductor and in parallel with each other;
a plurality of second coarse tune capacitors coupled to the second inductor and in parallel with each other;
a plurality of first fine tune capacitors coupled to the first inductor and in parallel with each other;
a plurality of second fine tune capacitors coupled to the second inductor and in parallel with each other;
a plurality of coarse tune switches, each coarse tune switch coupled between one of the first coarse tune capacitors and a corresponding second coarse tune capacitor; and
a linear voltage-controlled capacitance circuit coupled to the first inductor through the first fine tune capacitors and coupled to the second inductor through the second fine tune capacitors, the capacitance circuit comprising a plurality of differentially coupled MOS varactor pairs.

17. The circuit of claim 16, the capacitance circuit operable to receive a plurality of tuning bits, and the tank circuit operable to generate a positive tank node signal and a negative tank node signal based on the tuning bits.

18. The circuit of claim 17, further comprising a plurality of gain control switches coupled to the capacitance circuit, each gain control switch operable to provide a tuning bit to the capacitance circuit.

19. The circuit of claim 1, wherein the same tuning voltage comprises a non-differential tuning voltage.

* * * * *